(12) United States Patent
Kyoung et al.

(10) Patent No.: US 10,715,099 B2
(45) Date of Patent: Jul. 14, 2020

(54) BULK ACOUSTIC WAVE RESONATOR AND METHOD FOR MANUFACTURING THE SAME

(71) Applicant: SAMSUNG ELECTRO-MECHANICS CO., LTD., Suwon-si (KR)

(72) Inventors: Je Hong Kyoung, Suwon-si (KR); Jin Suk Son, Suwon-si (KR); Hwa Sun Lee, Suwon-si (KR); Sang Hyun Yi, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 317 days.

(21) Appl. No.: 15/704,225

(22) Filed: Sep. 14, 2017

(65) Prior Publication Data

US 2018/0123554 A1 May 3, 2018

(30) Foreign Application Priority Data

Oct. 28, 2016 (KR) .................. 10-2016-0142331
Mar. 23, 2017 (KR) .................. 10-2017-0036662

(51) Int. Cl.
*H03H 9/02* (2006.01)
*H03H 9/17* (2006.01)
*H03H 3/02* (2006.01)
*H03H 3/04* (2006.01)

(52) U.S. Cl.
CPC .......... *H03H 9/02047* (2013.01); *H03H 3/02* (2013.01); *H03H 9/02015* (2013.01); *H03H 9/02086* (2013.01); *H03H 9/02118* (2013.01); *H03H 9/02157* (2013.01); *H03H 9/173* (2013.01); *H03H 2003/021* (2013.01); *H03H 2003/0435* (2013.01); *H03H 2003/0442* (2013.01)

(58) Field of Classification Search
CPC combination set(s) only.
See application file for complete search history.

(56) References Cited

U.S. PATENT DOCUMENTS

2005/0035829 A1   2/2005  Umeda et al.
2005/0052261 A1*  3/2005  Yoon ............. H03H 9/173
                                                333/189

(Continued)

FOREIGN PATENT DOCUMENTS

| JP | 2005-94735 A | 4/2005 |
|---|---|---|
| JP | 2008-42380 A | 2/2008 |
| JP | 4044545 B2 | 2/2008 |
| JP | 4379475 B2 | 12/2009 |

(Continued)

OTHER PUBLICATIONS

English Translation of KR 10-2004-0084478, Shin (Year: 2004).*

(Continued)

*Primary Examiner* — Bryan P Gordon
(74) *Attorney, Agent, or Firm* — NSIP Law (57) ABSTRACT

A bulk acoustic wave resonator includes a substrate protective layer disposed on a top surface of a substrate, a cavity defined by a membrane layer and the substrate, and a resonating part disposed on the membrane layer. The membrane layer includes a first layer and a second layer, the second layer having the same material as the first layer and having a density greater than that of the first layer.

9 Claims, 7 Drawing Sheets

(56) References Cited

U.S. PATENT DOCUMENTS

| | | | |
|---|---|---|---|
| 2005/0140247 A1* | 6/2005 | Lee | H03H 3/04 310/320 |
| 2006/0170520 A1 | 8/2006 | Ha et al. | |
| 2007/0152540 A1 | 7/2007 | Fujii et al. | |
| 2007/0247260 A1* | 10/2007 | Yanase | H03H 3/02 333/187 |
| 2008/0042780 A1 | 2/2008 | Lee et al. | |
| 2010/0134210 A1* | 6/2010 | Umeda | H03H 3/04 333/189 |
| 2012/0241734 A1 | 9/2012 | Honda et al. | |
| 2013/0193431 A1 | 8/2013 | Yamazaki | |
| 2014/0017909 A1* | 1/2014 | Kato | C23C 16/45551 438/787 |
| 2015/0318837 A1* | 11/2015 | Zou | H03H 3/013 333/187 |
| 2016/0301380 A1 | 10/2016 | Lee et al. | |

FOREIGN PATENT DOCUMENTS

| | | |
|---|---|---|
| JP | 2012-216797 A | 11/2012 |
| JP | 2013-175716 A | 9/2013 |
| JP | 2014-22456 A | 2/2014 |
| KR | 10-2004-0084478 A | 10/2004 |
| KR | 10-2006-0087848 | 8/2006 |
| KR | 10-2016-0121351 A | 10/2016 |
| WO | WO 2009/013938 A1 | 1/2009 |

OTHER PUBLICATIONS

Korean Office Action dated Sep. 5, 2019 in counterpart Korean Patent Application No. 10-2017-0036662 (5 pages in English and 4 pages in Korean).

Japanese Office Action dated Apr. 2, 2019 in counterpart Japanese Patent Application No. 2018-085867 (6 pages in English and 3 pages in Japanese).

* cited by examiner

BULK ACOUSTIC WAVE RESONATOR AND METHOD FOR MANUFACTURING THE SAME

CROSS-REFERENCE TO RELATED APPLICATION(S)

This application claims the benefit under 35 USC § 119(a) of Korean Patent Application No. 10-2016-0142331 filed on Oct. 28, 2016, in the Korean Intellectual Property Office, and Korean Patent Application No. 10-2017-0036662 filed on Mar. 23, 2017, in the Korean Intellectual Property Office, the entire disclosures of which are incorporated herein by reference for all purposes.

BACKGROUND

1. Field

The following description relates to a bulk acoustic wave resonator and a method for manufacturing a bulk acoustic wave resonator.

2. Description of Related Art

In a bulk acoustic wave resonator (BAWR), crystal characteristics of a piezoelectric thin film have a significant influence on various aspects of bulk acoustic wave resonance performance. Therefore, various methods capable of improving the crystal characteristics of a piezoelectric thin film are currently being devised.

To improve crystal characteristics of a piezoelectric thin film, a common method is to optimize a deposition operation of aluminum nitride (AlN) for the piezoelectric layer. Such a method has a limit in improving crystal characteristics due to characteristics of the deposition operation. As an example, a typical deposition method may include securing crystallinity by optimizing the deposition operation of the piezoelectric layer or improving the type or the deposition operation of an electrode and a seed layer, which are lower layers.

A method for improving crystallinity of an electrode thin film may be used, in which a lower layer of aluminum nitride (AlN) to improve the crystal characteristics of the piezoelectric layer is used, but there is a limit in improving the crystallinity of the electrode thin film only by optimizing the deposition operation.

Therefore, it is useful to develop a structure capable of improving the crystal characteristics of the piezoelectric thin film capable of improving bulk acoustic wave resonance performance and a method for manufacturing the same.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic wave resonator includes a substrate protective layer disposed on a top surface of a substrate, a cavity defined by a membrane layer and the substrate, and a resonating part disposed on the membrane layer. The membrane layer includes a first layer and a second layer, the second layer having the same material as the first layer and having a density greater than that of the first layer.

The second layer may include a material formed when an RF-bias is applied to the substrate in a plasma state and provided with argon particles.

The membrane layer may include a material including silicon nitride or silicon oxide.

The resonating part may include a lower electrode formed on the membrane layer, a piezoelectric layer covering a portion of the lower electrode, and an upper electrode disposed on the piezoelectric layer.

The bulk acoustic wave resonator may further include a passivation layer disposed on the upper electrode and the lower electrode and a metal pad formed on portions of the upper electrode and the lower electrode where passivation layer is not formed.

The upper electrode may include a frame part disposed at an edge of an active area.

The membrane layer may be disposed parallel to the cavity, and may extend to cover a cavity forming layer.

In a general aspect, a method for manufacturing a bulk acoustic wave resonator, the method includes disposing a sacrificial layer on a substrate, covering the sacrificial layer with a membrane layer, soft etching the membrane layer to form a first layer and a second layer, and disposing a resonating part on the membrane layer.

The second layer may have a greater density than the first layer.

The soft etching may include applying an RF-bias to the substrate in a plasma state and providing argon particles.

The disposing of the resonating part may include disposing lower electrode on the membrane layer, covering least a portion of the lower electrode with a piezoelectric layer, and disposing an upper electrode on the piezoelectric layer.

The membrane layer may include a material containing silicon nitride or silicon oxide.

The method may further include exposing portions of the upper electrode and the lower electrode and disposing a metal pad on portions of the upper electrode and the lower electrode that are exposed externally.

The sacrificial layer may include a silicon-based material. A cavity may be formed by removing the sacrificial layer using a halide-based etching gas.

The forming of the upper electrode may include disposing a frame part at an edge of an active area.

The second layer may have a smaller thickness than the first layer.

The second layer may have a surface roughness lower than that of the first layer.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Figure 1:
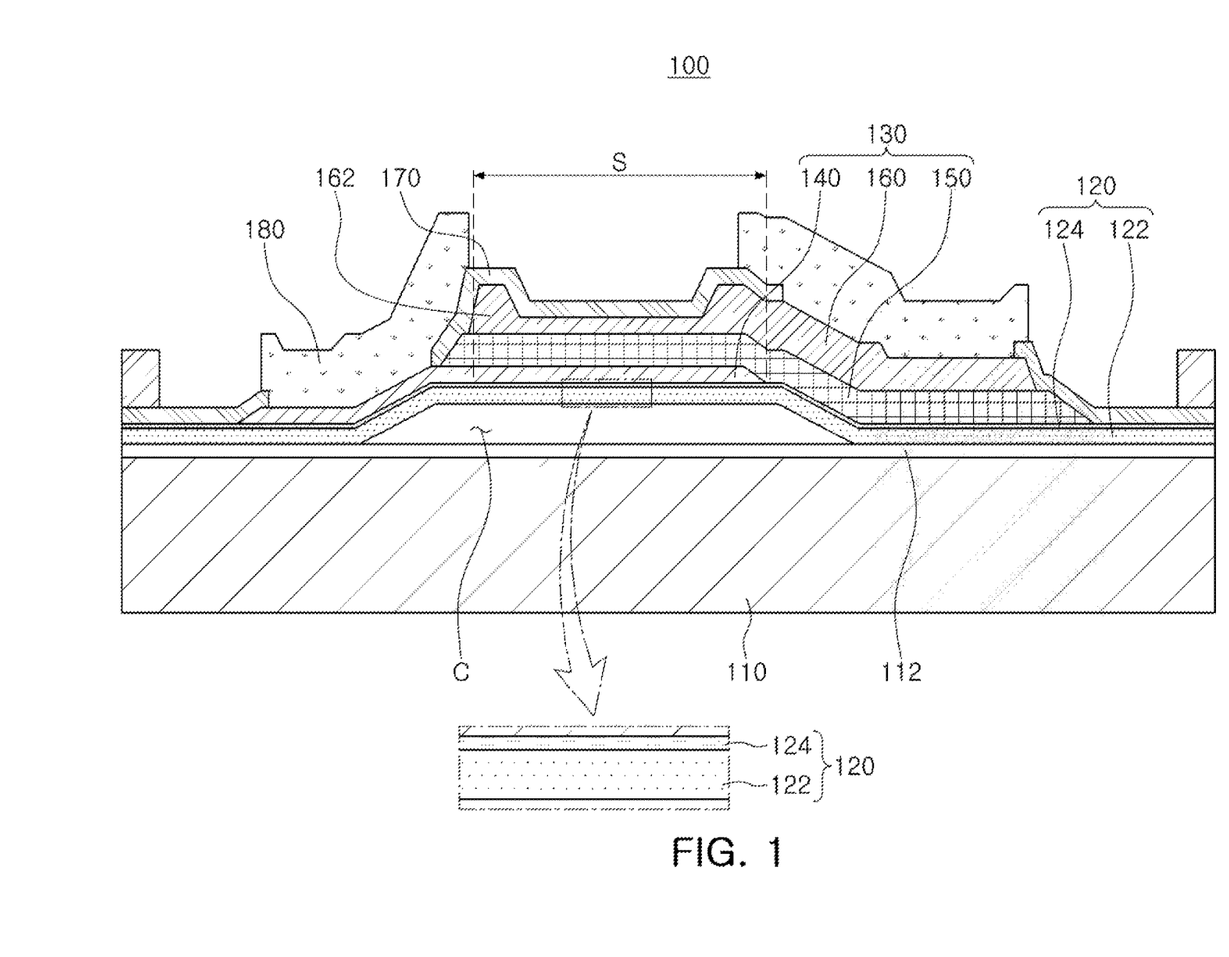
FIG. 1 is a schematic cross-sectional view illustrating an example of a bulk acoustic wave resonator.

FIG. 1 is a schematic cross-sectional view illustrating an example of a bulk acoustic wave resonator.

Referring to FIG. 1, a bulk acoustic wave resonator 100 includes a substrate 110, a membrane layer 120, a resonator 130, a passivation layer 170, and a metal pad 180.

The substrate 110 may include a substrate and silicon stacked on the substrate. For example, a silicon wafer forms the substrate. The substrate 110 includes a substrate protective layer 112 disposed to face a cavity C.

The substrate protective layer 112 may prevent damage when the cavity C is formed.

As an example, the substrate protective layer 112 is formed of a material containing silicon nitride ($Si_3N_4$) or silicon oxide ($SiO_2$).

The membrane layer 120 forms the cavity C together with the substrate 110. The membrane layer 120 may be formed on a sacrificial layer 190 (described below with reference to FIG. 6), and may form the cavity C together with the substrate protective layer 112 by removing the sacrificial layer 190. As an example, the membrane layer 120 is formed of a material having low reactivity with halide-based etching gases such as fluorine (F), chlorine (Cl) and the like for removing a silicon-based sacrificial layer 190.

As an example, the membrane layer 120 is formed of a material containing silicon nitride ($Si_3N_4$) or silicon oxide ($SiO_2$).

The membrane layer 120 includes a first layer 122 and a second layer 124 which is formed of the same material as the first layer 122 and has density greater than that of the first layer 122. The first layer 122 may have a thickness thicker than that of the second layer 124. In other words, the second layer 124 may disposed on the first layer 122, and the first layer 122 may be deformed into the second layer 124 by a surface treatment.

As an example, the second layer 124 is be formed in a soft etching operation. That is, the second layer 124 may be formed by performing the soft etching operation for the membrane layer 120 before forming a resonating part 130.

The soft etching operation may be performed by applying an RF-bias to the substrate 110 in a plasma state to cause argon particles (Ar+) to collide with a surface of the membrane layer 120. Accordingly, the second layer 124 is formed on the first layer 122 to form membrane layer 120.

The resonating part 130 is formed on the membrane layer 120. As an example, the resonating part 130 includes a lower electrode 140, a piezoelectric layer 150, and an upper electrode 160.

The lower electrode 140 is formed on the membrane layer 120. More specifically, the lower electrode 140 is formed on the membrane layer 120 so that a portion thereof is disposed on the cavity C.

As an example, the lower electrode 140 is formed of a conductive material such as molybdenum (Mo), ruthenium (Ru), tungsten (W), iridium (Ir), platinum (Pt), or the like, or alloys thereof.

The lower electrode 140 may be used as any one of an input electrode that inputs an electric signal such as a radio frequency (RF) signal, and an output electrode. For example, in a case in which the lower electrode 140 is the input electrode, the upper electrode 160 may be the output electrode, and in a case in which the lower electrode 140 is the output electrode, the upper electrode 160 may be the input electrode.

The piezoelectric layer 150 covers at least a portion of the lower electrode 140. The piezoelectric layer 150 may convert the signal input through the lower electrode 140 or the upper electrode 160 into elastic waves. That is, the piezoelectric layer 150 may convert an electrical signal into the elastic waves by physical vibration.

As an example, the piezoelectric layer 150 is formed by depositing aluminum nitride, doped aluminum nitride, zinc oxide, or lead zironate titanate.

The piezoelectric layer 150 formed of aluminum nitride (AlN) may further include a rare earth metal. As an example, the rare earth metal includes at least one of scandium (Sc), erbium (Er), yttrium (Y), and lanthanum (La). The piezoelectric layer 150 formed of aluminum nitride (AlN) may further include a transition metal. As an example, the transition metal may include at least one of zirconium (Zr), titanium (Ti), magnesium (Mg), and hafnium (Hf).

The upper electrode 160 covers the piezoelectric layer 150, and may be formed of a conductive material such as molybdenum (Mo), ruthenium (Ru), tungsten (W), iridium (Ir), platinum (Pt), or the like, or alloys thereof.

The upper electrode 160 includes a frame part 162. The frame part 162 may refer to a portion of the upper electrode 160 having a thickness greater than that of the remaining portion of the upper electrode 160. The frame part 162 is included in the upper electrode 160 except for in a central portion of an active area S.

The frame part 162 may reflect lateral waves generated at the time of resonating into the active area S to confine resonant energy to the active area S. In other words, the frame part 162 may be formed to be disposed at an edge of the active area S to prevent vibration from escaping the active area S to the outside.

Here, the active area S may be defined as an area in which all three layers of the lower electrode 140, the piezoelectric layer 150, and the upper electrode 160 are stacked.

The passivation layer 170 may be formed on areas except for portions of the lower electrode 140 and the upper electrode 150. The passivation layer 170 may prevent damage to the upper electrode 160 and the lower electrode 140 during the operation.

Further, in order to adjust a frequency, a thickness of the passivation layer 170 may be adjusted by etching. As the passivation layer 170, for example, a dielectric layer containing any one material of manganese oxide (MgO), zirconium oxide ($ZrO_2$), aluminum nitride (AlN), lead zirconate titanate (PZT), gallium arsenic (GaAs), hafnium oxide ($HfO_2$), aluminum oxide ($Al_2O_3$), titanium oxide ($TiO_2$), and zinc oxide (ZnO) may be used.

The metal pad 180 is formed on portions of the lower electrode 140 and the upper electrode 160 on which the passivation layer 170 is not formed. As an example, the metal pad 180 is formed of materials such as gold (Au), a gold-tin (Au—Sn) alloy, copper (Cu), a copper-tin (Cu—Sn) alloy, and/or the like.

As described above, since the membrane layer 120 includes the first layer 122 and the second layer 124, crystallinity of the piezoelectric layer 150 disposed on the second layer 124 may be improved.

Figure 2:
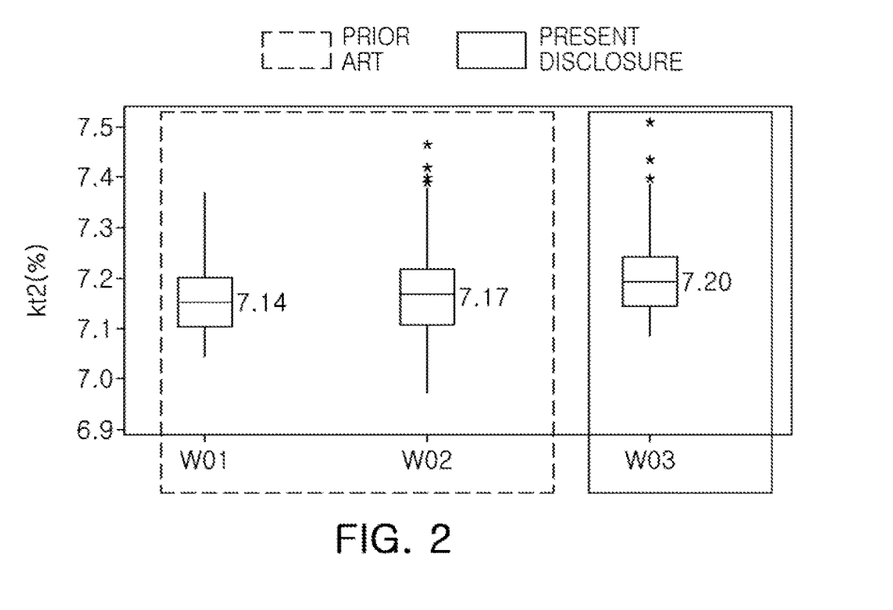
FIGS. 2, 3, and 4 are graphs illustrating examples of effects of the bulk acoustic wave resonators of FIG. 1.
Figure 3:
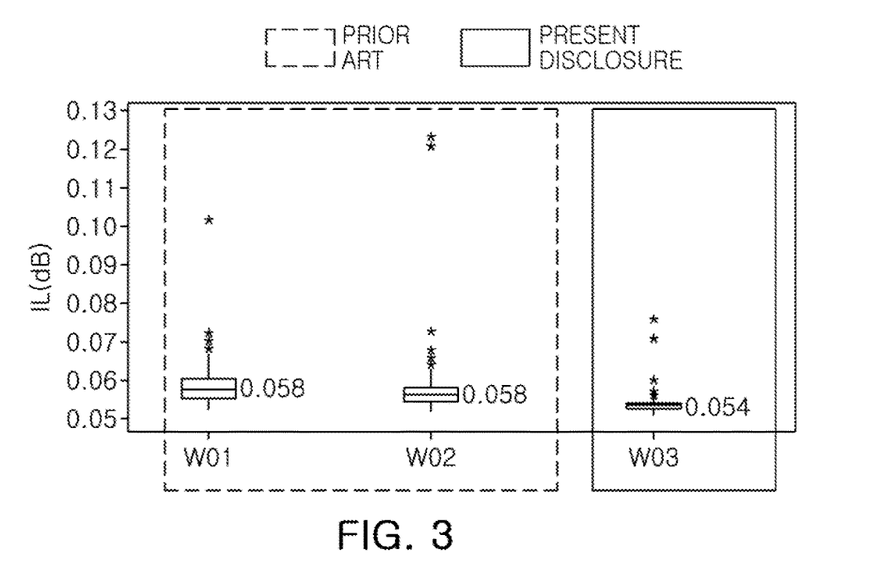
Figure 4:
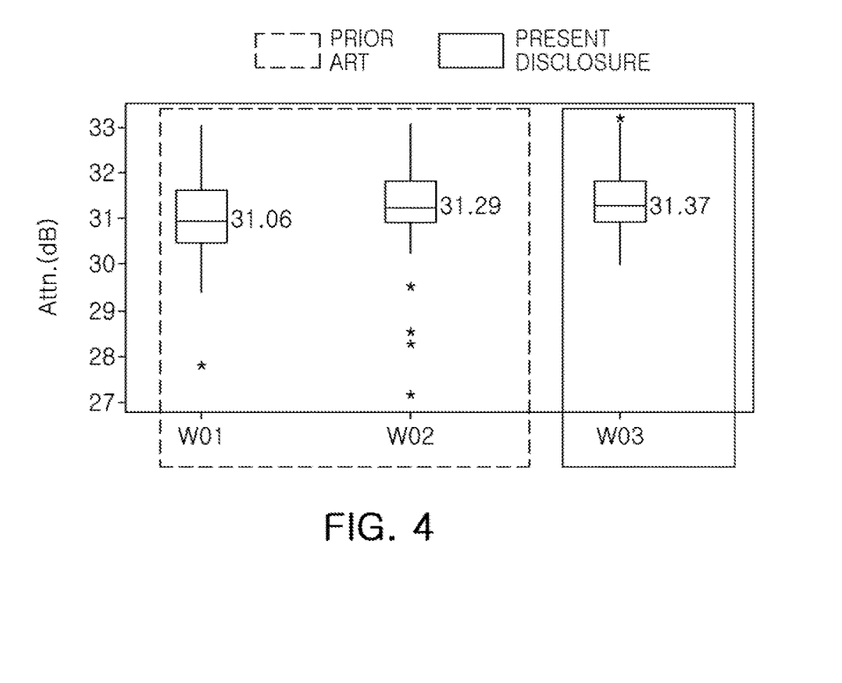

Accordingly, it may be seen that performances (kt2, IL, Attenuation) of the bulk acoustic wave resonator 100 may be improved as compared to a conventional bulk acoustic wave resonator, as illustrated in FIGS. 2 through 4.

Hereinafter, a method for manufacturing the bulk acoustic wave resonator of FIG. 1 will be described with reference to the drawings.

FIGS. 5, 6, 7, 8, 9, 10, and 11 are process flowcharts illustrating an exemplary method for manufacturing the bulk acoustic wave resonator of FIG. 1.

Figure 5:
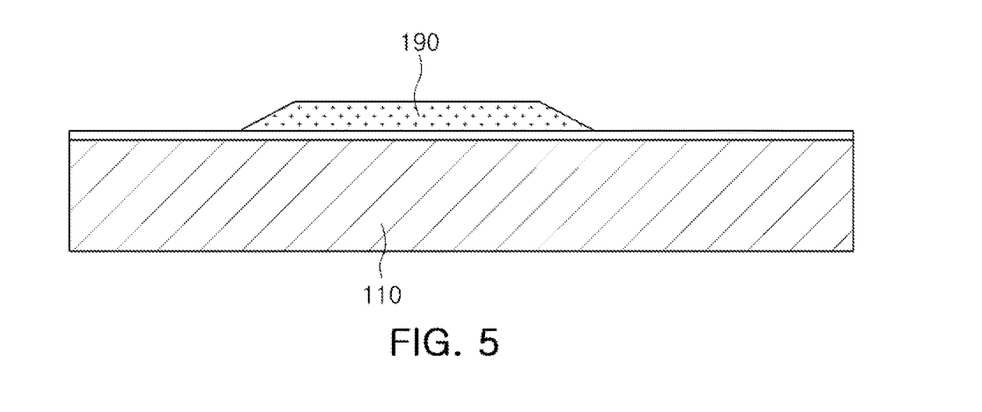
FIGS. 5, 6, 7, 8, 9, 10, and 11 are process flowcharts illustrating examples of methods for manufacturing the bulk acoustic wave resonator of FIG. 1.

First, as illustrated in FIG. 5, the sacrificial layer 190 is formed on the substrate 110. The sacrificial layer 190 is formed on a portion of the substrate 110, and has inclined surfaces formed at edges thereof.

Figure 6:
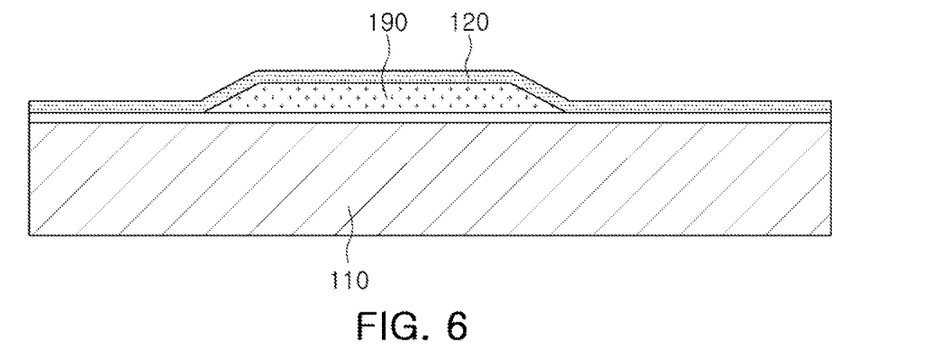

As illustrated in FIG. 6, the membrane layer 120 is then formed to cover the sacrificial layer 190. The membrane layer 120 may be formed of a material containing silicon nitride ($Si_3N_4$) or silicon oxide ($SiO_2$).

Figure 7:
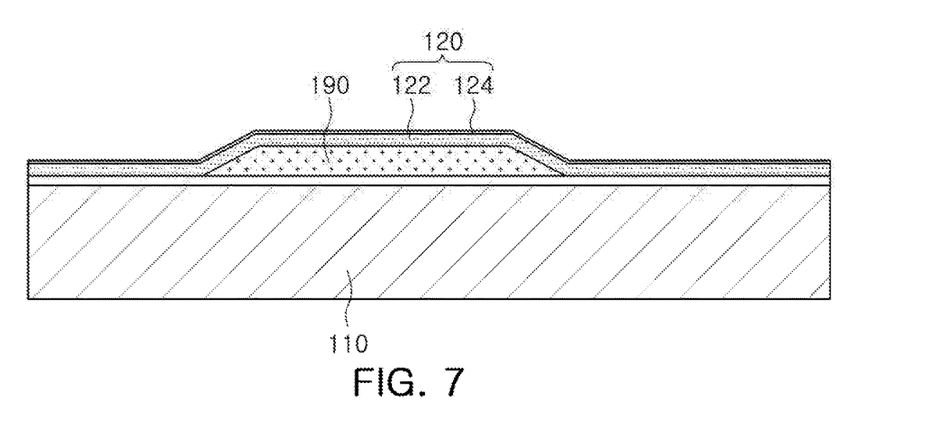

As illustrated in FIG. 7, the membrane layer 120 is formed into the first layer 122 and the second layer 124 by a soft etching operation. The soft etching operation may be performed by applying an RF-bias to the substrate 110 in a plasma state to cause argon particles (Ar+) to collide with a surface of the membrane layer 120. Accordingly, the second layer 124 is formed on the membrane layer 120.

Figure 8:
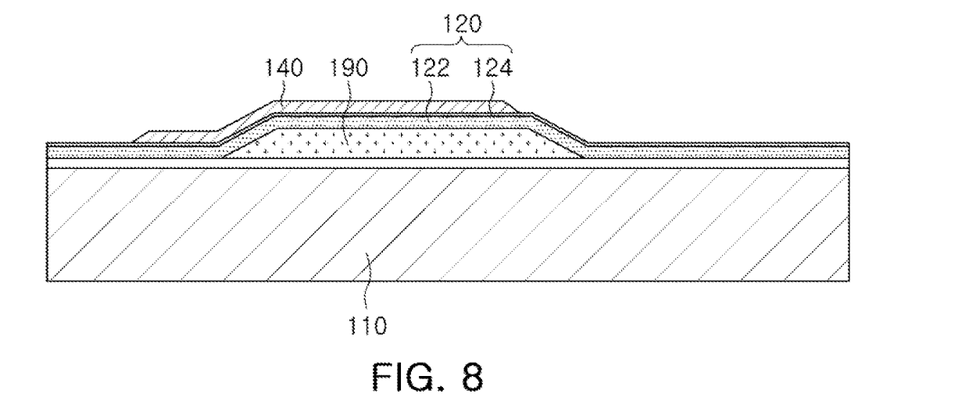

As illustrated in FIG. 8, the lower electrode 140 is then formed on the membrane layer 120. That is, the lower electrode 140 is formed on the second layer 124 of the membrane layer 120. The lower electrode 140 is formed on the membrane layer 120 such that a portion thereof is disposed on the sacrificial layer 190.

Figure 9:
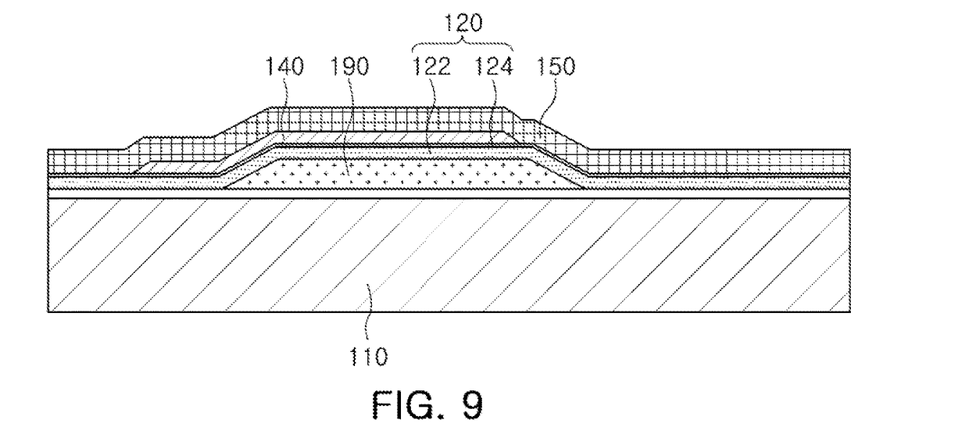

As illustrated in FIG. 9, the piezoelectric layer 150 is then formed. The piezoelectric layer 150 may be formed by depositing aluminum nitride, doped aluminum nitride, zinc oxide, or lead zironate titanate.

The piezoelectric layer 150 formed of aluminum nitride (AlN) may further include a rare earth metal. As an example, the rare earth metal includes at least one of scandium (Sc), erbium (Er), yttrium (Y), and lanthanum (La). The piezoelectric layer 150 formed of aluminum nitride (AlN) may further include a transition metal. As an example, the transition metal includes at least one of zirconium (Zr), titanium (Ti), magnesium (Mg), and hafnium (Hf).

Figure 10:
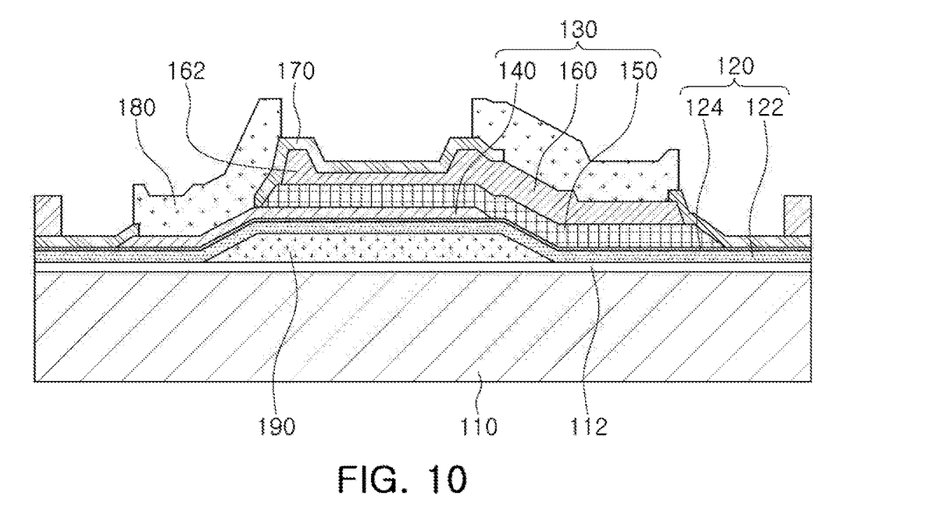

As illustrated in FIG. 10, the upper electrode 160 is formed on the piezoelectric layer 150. The passivation layer 170 and the metal pad 180 are then sequentially formed.

Figure 11:
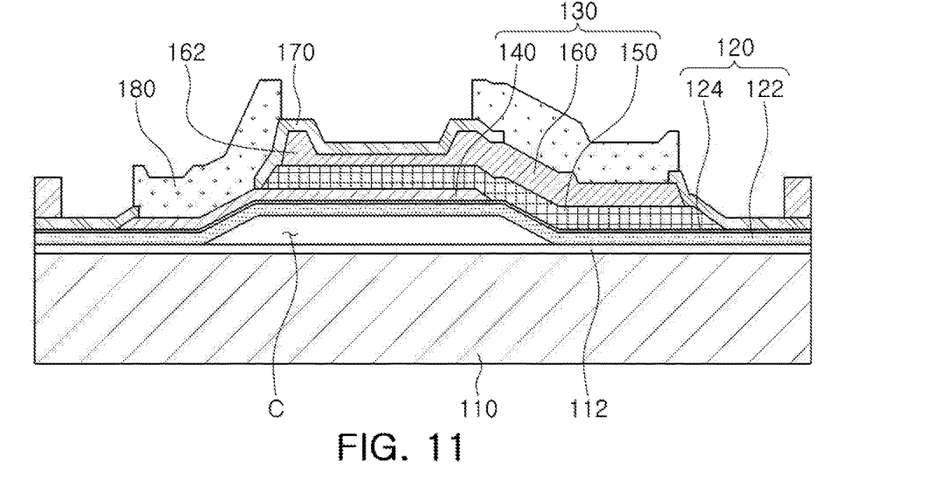

As illustrated in FIG. 11, the cavity C is then formed below the membrane layer 120 by removing the sacrificial layer 190.

As described above, since the membrane layer 120 includes the first layer 122 and the second layer 124, crystallinity of the piezoelectric layer 150 formed to be disposed on the second layer 124 may be improved.

Accordingly, performance of the bulk acoustic wave resonator 100 may be improved.

Figure 12:
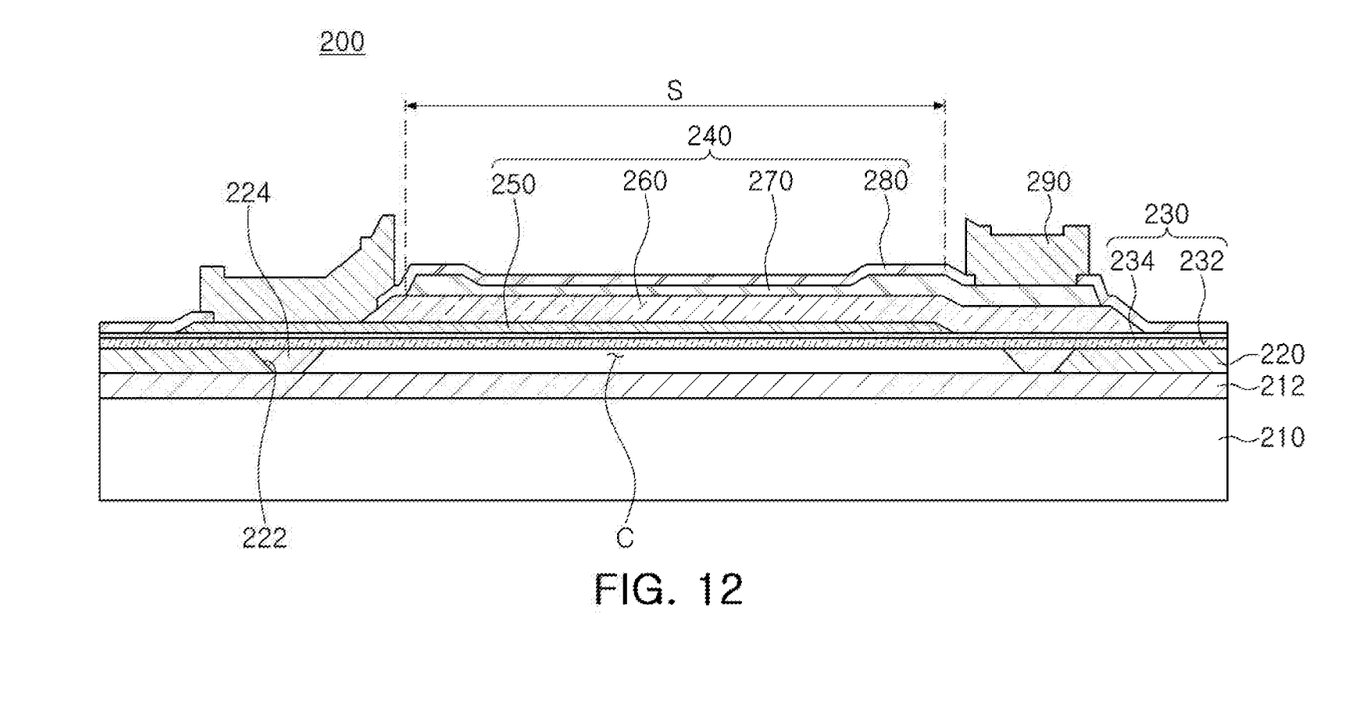
FIG. 12 is a schematic cross-sectional view illustrating an example of a bulk acoustic wave resonator.

FIG. 12 is a schematic cross-sectional view illustrating an example of a bulk acoustic wave resonator.

Referring to FIG. 12, a bulk acoustic wave resonator 200 includes, a substrate 210, a cavity forming layer 220, a membrane layer 230, a resonating part 240, a passivation layer 280, and a metal pad 290.

The substrate 210 may include substrate and silicon stacked on the substrate. For example, a silicon wafer forms the substrate. A substrate protective layer 212 for protecting the silicon may be formed on an upper surface of the substrate 210.

The substrate protective layer 212 may prevent damage when the cavity C is formed.

As an example, the substrate protective layer 112 is formed of a material containing silicon nitride ($Si_3N_4$) or silicon oxide ($SiO_2$).

The cavity forming layer 220 is formed on the substrate 210, and the cavity C is formed by a cavity forming groove 222 of the cavity forming layer 220 and the membrane layer 230. That is, the cavity C is formed by forming the sacrificial layer in the cavity forming groove 222 of the cavity forming layer 220 and then removing the sacrificial layer.

As such, since the cavity C is formed in the cavity forming layer 220, the resonating part 240 formed on the cavity forming layer 220, for example, a lower electrode 250, a piezoelectric layer 260, and the like, are formed in a flat shape.

An etch preventing layer 224 for preventing etching at the time of removing the sacrificial layer may be provided at an edge of the cavity forming groove 222.

The membrane layer 230 forms the cavity C together with the substrate 210. The membrane layer 230 is formed on the sacrificial layer, the membrane layer 230 forms the cavity C together with the substrate protective layer 212 by removing the sacrificial layer. The membrane layer 220 may be formed of a material having low reactivity with halide-based etching gases such as fluorine (F), chlorine (Cl), and the like, for removing a silicon-based sacrificial layer.

As an example, the membrane layer 230 may be formed of a material containing silicon nitride ($Si_3N_4$) or silicon oxide ($SiO_2$).

The membrane layer 230 includes a first layer 232, and a second layer 234 which is formed of the same material as the first layer 232 and has density greater than that of the first layer 232. The first layer 232 may have a thickness thicker than that of the second layer 234. In other words, the second layer 234 is disposed on the first layer 232, and the first layer 232 is deformed into the second layer 234 by a surface treatment.

As an example, the second layer 234 may be formed by a soft etching operation. That is, the second layer 234 may be formed by performing the soft etching operation before forming the resonating part 240.

The soft etching operation may be performed by applying an RF-bias to the substrate 210 in a plasma state to cause argon particles (Ar+) to collide with a surface of the membrane layer 230. Accordingly, the second layer 234 is formed on the membrane layer 230.

The resonating part 240 is formed on the membrane layer 230. The resonating part 240 includes a lower electrode 250, a piezoelectric layer 260, and an upper electrode 270.

Since the components of the resonating part 240, that is, the lower electrode 250, the piezoelectric layer 260, and the upper electrode 270 are substantially the same components as the lower electrode 140, the piezoelectric layer 150, and the upper electrode 160 described in the bulk acoustic wave resonator 100 shown in FIG. 1, a detailed description thereof will be omitted and will be replaced with the description above.

Since the passivation layer 280 and the metal pad 290 are substantially the same components as the passivation layer 170 and the metal pad 180 described in the bulk acoustic wave resonator 100 shown in FIG. 1, a detailed description thereof will be omitted and will be replaced with the description above.

As described above, since the membrane layer 230 includes the first layer 232 and the second layer 234, crystallinity of the piezoelectric layer 260 disposed on the second layer 234 may be improved.

As set forth above, according to the examples presented above, the resonance characteristics of a bulk acoustic wave resonator may be improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator, comprising:
    a substrate protective layer disposed on a top surface of a substrate;
    a cavity defined by a membrane layer the substrate; and
    a resonating part disposed on the membrane layer,
    wherein the membrane layer comprises a first layer and a second layer, the second layer comprising the same material as the first layer and having a density greater than that of the first layer.

2. The bulk acoustic wave resonator of claim 1, wherein the second layer comprises a material formed when an RF-bias is applied to the substrate in a plasma state and provided with argon particles.

3. The bulk acoustic wave resonator of claim 1, wherein the membrane layer comprises a material comprising silicon nitride or silicon oxide.

4. The bulk acoustic wave resonator of claim 1, wherein the resonating part comprises:
    a lower electrode formed on the membrane layer;
    a piezoelectric layer covering a portion of the lower electrode; and
    an upper electrode disposed on the piezoelectric layer.

5. The bulk acoustic wave resonator of claim 4, further comprising:
    a passivation layer disposed on the upper electrode and the lower electrode; and
    a metal pad formed on portions of the upper electrode and the lower electrode where passivation layer is not formed.

6. The bulk acoustic wave resonator of claim 5, wherein the upper electrode comprises a frame part disposed at an edge of an active area.

7. The bulk acoustic wave resonator of claim 1, wherein the membrane layer is disposed parallel to the cavity, and extends to cover a cavity forming layer.

8. The bulk acoustic wave resonator of claim 1, wherein the first layer is disposed between the substrate and the second layer.

9. The bulk acoustic wave resonator of claim 4, wherein the first layer is disposed adjacent to the cavity and the second layer is disposed adjacent to the lower electrode.

\* \* \* \* \*